United States Patent
Chu et al.

(10) Patent No.: US 7,859,337 B1
(45) Date of Patent: Dec. 28, 2010

(54) WIDEBAND DRIVER FOR CLASS-D POWER AMPLIFIERS

(75) Inventors: Thanh D. Chu, Cedar Rapids, IA (US); Scott L. Heibel, Hiawatha, IA (US); Gamal M. Hegazi, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 719 days.

(21) Appl. No.: 11/796,293

(22) Filed: Apr. 27, 2007

(51) Int. Cl.
*H03F 3/217* (2006.01)

(52) U.S. Cl. ...................... 330/251; 330/301
(58) Field of Classification Search .............. 330/251, 330/51, 207 A, 301
See application file for complete search history.

(56) References Cited

U.S. PATENT DOCUMENTS

| | | | |
|---|---|---|---|
| 3,714,597 A | 1/1973 | Reynolds | |
| 4,032,851 A * | 6/1977 | Hoover | 455/332 |
| 5,023,566 A | 6/1991 | El-Hamamsy | |
| 5,053,719 A | 10/1991 | Tsai | |
| 5,306,986 A * | 4/1994 | Siao | 315/248 |
| 6,198,347 B1 | 3/2001 | Sander | |
| 6,756,874 B2 * | 6/2004 | Buckles et al. | 336/180 |
| 6,949,978 B2 | 9/2005 | Tayrani | |

OTHER PUBLICATIONS

Sevick, Jerry, "Transmission Line Transformers," fourth edition, Noble Publishing Corporation 2001, Chapter 1 Analysis, Section 1.1 Introduction, pp. 1-1 and 1-2.

* cited by examiner

*Primary Examiner*—Robert Pascal
*Assistant Examiner*—Khiem D Nguyen
(74) *Attorney, Agent, or Firm*—Matthew J. Evans; Daniel M. Barbieri

(57) ABSTRACT

A Class-D amplifier having a wideband driver circuit including a first transmission line transformer and a second transmission line transformer. An input of the first transmission line transformer is approximately 180 degrees out of phase from an input of the second transformer. A first transistor (Q1) has an input operatively connected to the first transmission line transformer. A second transistor (Q2) has an input being operatively connected to the second transmission line transformer. The first and the second transmission line transformers cooperate to provide a signal of sufficient magnitude to saturate their associated power transistors in the ON mode and to cut them off in the OFF mode with very small rise and fall transit times, thus providing high efficiency.

16 Claims, 4 Drawing Sheets

US 7,859,337 B1

WIDEBAND DRIVER FOR CLASS-D POWER AMPLIFIERS

GOVERNMENT LICENSE RIGHTS

The U.S. Government has a paid-up license in this invention and the right in limited circumstances to require the patent owner to license others on reasonable terms as provided for by the terms of Government Contract No. N00421-06-2-0001 awarded by the Office of Naval Research.

BACKGROUND OF THE INVENTION

1. Field of the Invention

The present invention relates to power amplifiers and more particularly to a wideband driver for a Class-D power amplifier.

2. Description of the Related Art

Implementation of high efficiency class-D amplifiers has been limited to HF frequencies due to the difficulty of operating the power transistors as ideal switches at higher frequencies such as VHF/UHF range and beyond.

FIG. 1 (Prior Art) shows a classical driving circuit for the complementary voltage-switching class D amplifier. It is difficult to realize the transformer T1 at high frequency since it utilizes a flux linkage method which works from a few KHz up to only about 200 MHz.

U.S. Pat. No. 6,949,978 issued to R. Tayrani et al, entitled "Efficient Broadband Switching-Mode Amplifier," discloses an amplifier that includes a mechanism for amplifying an input signal via a high-speed switch and providing an amplified signal in response thereto. Another mechanism filters the amplified signal via common mode rejection and provides an output signal in response thereto. In a specific embodiment, the mechanism for filtering includes a first mechanism for separating an input signal into plural intermediate signals. The mechanism for amplifying includes a second mechanism for amplifying the plural intermediate signals via one or more high-speed switches and providing plural amplified signals in response thereto. The mechanism for filtering further includes a third mechanism for employing common mode rejection to filter the plural amplified signals, yielding a single output signal in response thereto. As shown in FIG. 1 of the Tayrani disclosure utilizes one Balun 1:1 transformer at the input. The Balun 1:1 provides two inputs, which are 180 degrees out of phase to drive each following transistor.

U.S. Pat. No. 5,023,566 issued to El-Hamamsy et al, entitled "Driver for a High Efficiency, High Frequency Class-D Power Amplifier," discloses a driver circuit for a voltage-switching, high frequency Class-D power amplifier provides an input sinewave power signal and controls the transition time between switching the two active devices thereof, resulting in substantially lossless switching. The transition time is optimized by controlling the amplitude of the voltage signals at the inputs of the two active devices, depending on the output capacitance of the switching devices, the threshold voltage of the switching devices, the power output requirement, and the impedance of the resonant load network of the Class-D power amplifier. As shown in FIG. 2 of the El-Hamamsy disclosure one conventional transformer (T1) is used at the input, which is 180 degrees out of phase to drive the following transistors. El-Hamamsy et al use a Class-E amplifier as the driver to provide signals to the conventional transformer. The focus of the disclosure is on controlling the amplitudes of the waveforms into the Class-D amplifiers.

It is desired that power transistors be operated as ideal switches at frequencies higher than the HF frequencies to allow implementation of Class-D amplifiers.

SUMMARY OF THE INVENTION

In a broad aspect, the present invention is a Class-D amplifier that includes a wideband driver circuit, including a first transmission line transformer; and, a second transmission line transformer. An input of the first transmission line transformer is approximately 180 degrees out of phase from an input of the second transformer. A first transistor (Q1) has an input operatively connected to the first transmission line transformer. A second transistor (Q2) has an input being operatively connected to the second transmission line transformer. The first and the second transmission line transformers cooperate to provide a signal of sufficient magnitude to saturate their associated power transistors in the ON mode and to cut them off in the OFF mode with very small rise and fall transit times, thus providing high efficiency.

The first transmission line transformer 14 is preferably a wideband Balanced-to-Unbalanced transmission line transformer (BALUN). The second transmission line transformer 16 is preferably a wideband Unbalanced-to-Unbalanced transmission line transformer (UNUN).

In the circuit described by R. Tayrani et al, the input BALUN provides the first and second intermediate signals due to the coupling from the primary line/winding to the second and third line/windings. At VHF and UHF ranges such a device could be bulky in size and relatively high in loss. There is also a need for separate input matching networks. The magnitude and phase imbalances of the signals provided to the following transistors are controlled by the design of the BALUN itself, which could strain the designer.

In the proposed circuit by El-Hamamsy et al, the class E amplifier in conjunction with the isolation transformer provides the necessary two equal amplitude and 180 degree out-of-phase signals to the following transistors. Again the balance in magnitude and phase between these two signals depend on the design of the isolation transformer, which could be difficult to build.

In the present invention, the BALUN and UNUN provide a matching capability and isolation. An equal magnitude and 180-degree phase rotation are preferably provided by a preceding differential amplifier. This eases the design of the BALUN and UNUN. At VHF and UHF, broadband differential amplifiers with tight amplitude and phase balance are available.

DETAILED DESCRIPTION OF THE INVENTION

Figure 1:
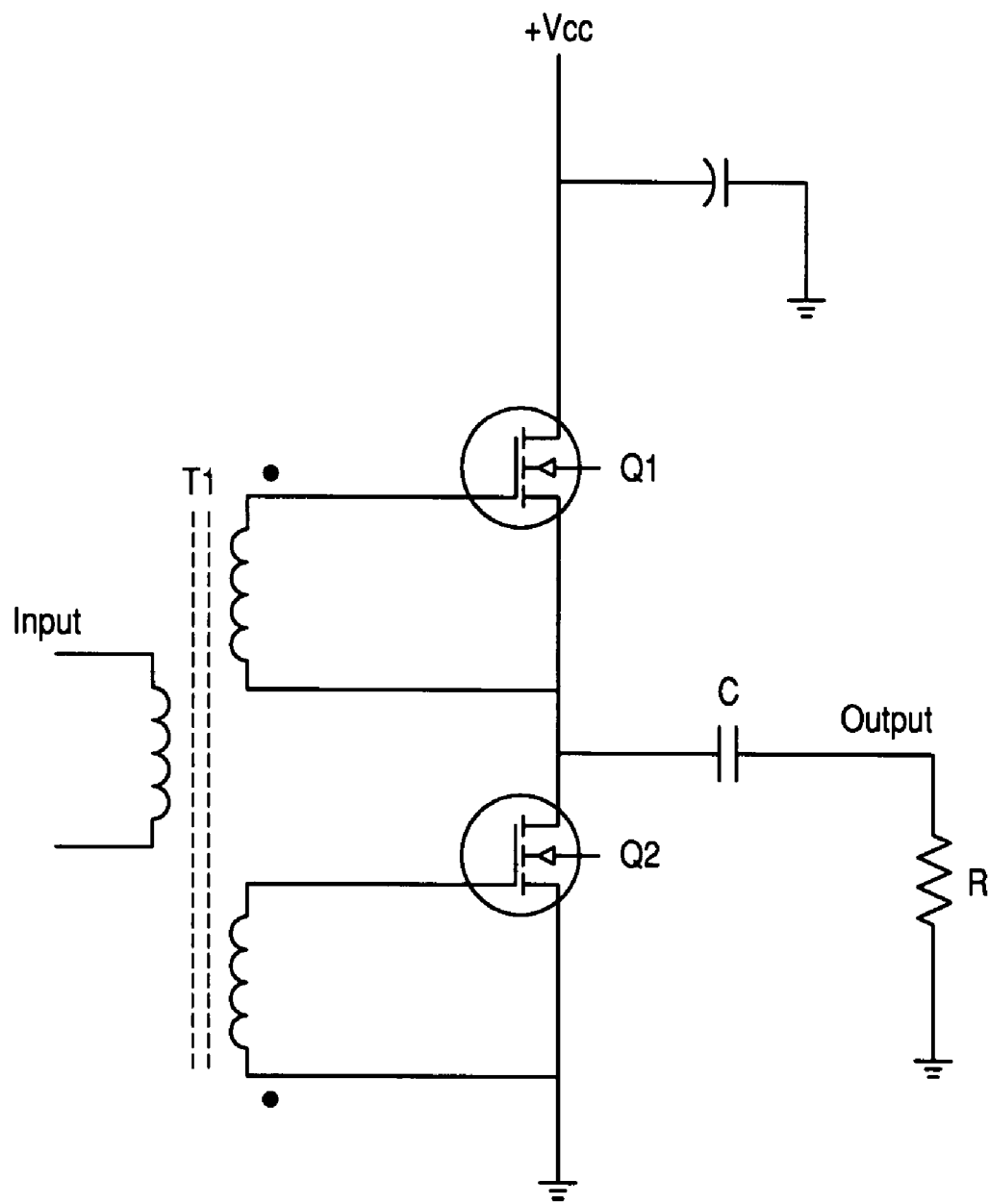
FIG. 1 (Prior Art) is schematic illustration of a complementary voltage-switching Class-D amplifier having a classical driving circuit.
Figure 2:
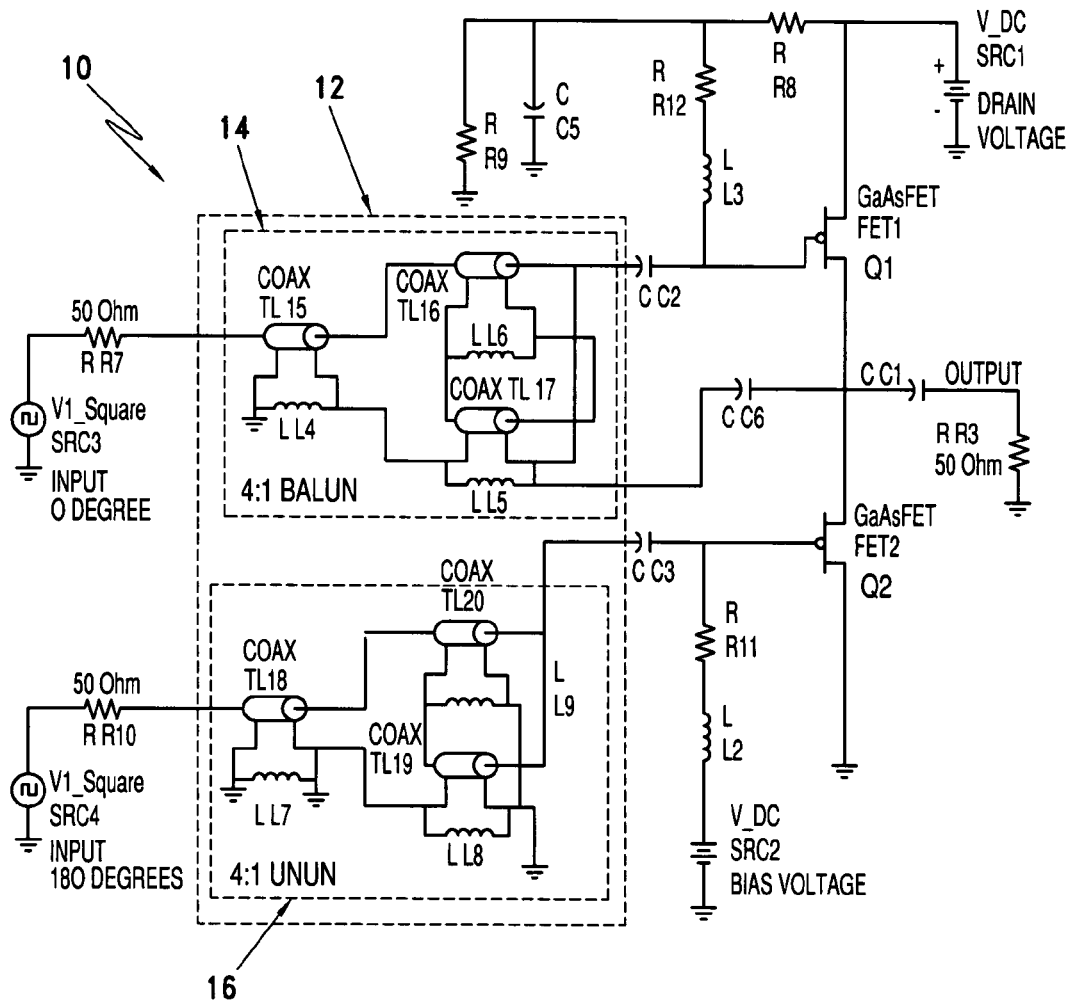
FIG. 2 is a schematic illustration a Class-D amplifier of the present invention with a wideband driver embodying the principles of the present invention.

Referring now to the drawings and the characters of reference marked thereon, FIG. 2 illustrates a preferred embodiment of the Class-D amplifier of the present invention, designated generally as 10. The amplifier 10 includes a wideband driver circuit, designated generally as 12, that includes a first transmission line transformer 14 and a second transmission line transformer 16. The first transmission line transformer 14 is preferably a wideband Balanced-to-Unbalanced transmission line transformer (BALUN). The second transmission line transformer 16 is preferably a wideband Unbalanced-to-Unbalanced transmission line transformer (UNUN). The term transmission line transformer, as used herein, refers to a transformer that transmits the energy to its output circuit by a transverse transmission line mode. This term is known to those skilled in the art and is discussed, for example, in the reference by Sevick, Jerry, "Transmission Line Transformers," fourth edition, Noble Publishing Corporation 2001, Chapter 1 Analysis, Section 1.1 Introduction, pgs. 1-1 and 1-2. The transformer typically comprises a transmission line wound on ferrite cores or air cores. The transmission lines are typically coaxial cables or bifilar wires. However, the transmission lines may be striplines or microstrip lines on a printed circuit board with embedded ferrite cores.

The inputs to BALUN 14 and UNUN 16 may be a square waveforms or sinusoidal waveforms. However, these input signals should be of sufficient magnitude to saturate their associated power transistors in the ON mode and to cut them off in the OFF mode with very small rise and fall transit times, thus providing high efficiency, as will be explained below in more detail.

A first transistor Q1 has an input operatively connected to the first transmission line transformer 14. A second transistor Q2 has an input operatively connected to the second transmission line transformer 16. The transistors, Q1 and Q2, are connected in a complementary class D or "totem pole" configuration.

Q1 and Q2 should be as similar as possible (i.e. a matched pair). Q1 and Q2 are typically bipolar junction transistors (BJT's) or Field Effect transistors (FET's). FIG. 2 shows two FET's. However, if a pair of BJT's are used the Emitter of Q1 is connected to the Collector of Q2 and to the output load (R3). The Source of Q1 is connected to the Drain of Q2 and to the output load (R3).

In the embodiment shown in FIG. 2 the BALUN used is a 4:1 BALUN and the UNUN used is a 4:1 UNUN. However, they both can be step-down transformers with different impedance ratios (e.g 1:1) or can be step-up transformers with different impedance ratios (e.g 1:2). The ratio will depend on the matching of the source internal impedances associated with SRC3 and SRC4 (not shown in FIG. 2) and the input impedances of the transistors Q1 and Q2. In the example shown in FIG. 2 the 4:1 BALUN and a 4:1 UNUN are utilized because they convert the 50 Ohm internal resistances of the SRC3 and SRC4 sources to the approximated 12.5 Ohm input impedances of the transistors Q1 and Q2.

R8, R9, R12, L3, and C5 are the DC bias circuit for Q1. So are R11, L2 for Q2. C1, C2, C3, and C6 are DC-blocking capacitors. R3 represents the output load. R7, R10 are the internal resistance of the input sources, SRC3 and SRC4, respectively.

Figure 3:
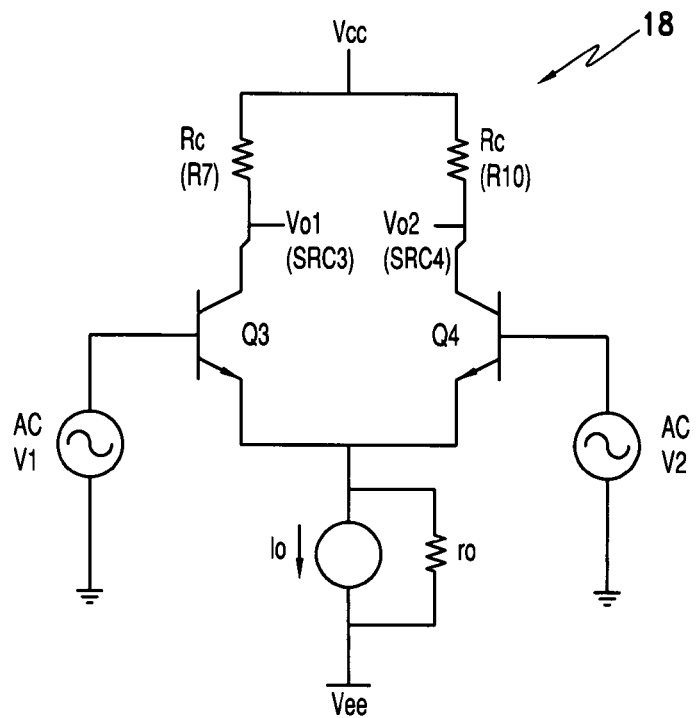
FIG. 3 is schematic illustration of a differential amplifier utilized with the wideband driver of the present invention.

A differential amplifier may be connected to the first transmission line transformer and to the second transmission line transformer for providing the inputs of the first and second transmission line transformers. Referring now to FIG. 3, such a differential amplifier is illustrated, designated generally as 18. The differential amplifier can turn its single-ended input (V1) into two equal-amplitude and 180-degree out-of-phase at its separated outputs (Vo1 and Vo2). Vo1 and Vo2 correlate to SRC3 and SRC4 in FIG. 2. The internal impedances (Rc) associated with each output are also equal. These internal impedances correlate to R7 and R10 of FIG. 2. In this case, V2 is shorted. V1 is the single-ended source. Q3 and Q4 are matched devices.

The role of a differential amplifier can be realized with a circuit which is able to generate two outputs with equal magnitude and 180-degree out of phase. In this sense, a 180 degree Hybrid Coupler can be an alternative. At VHF the resulting size large may make use of a Hybrid Coupler prohibitive. Moreover, it has loss instead of gain as in the differential amplifier because the former is usually regarded as a passive device.

Figure 4:
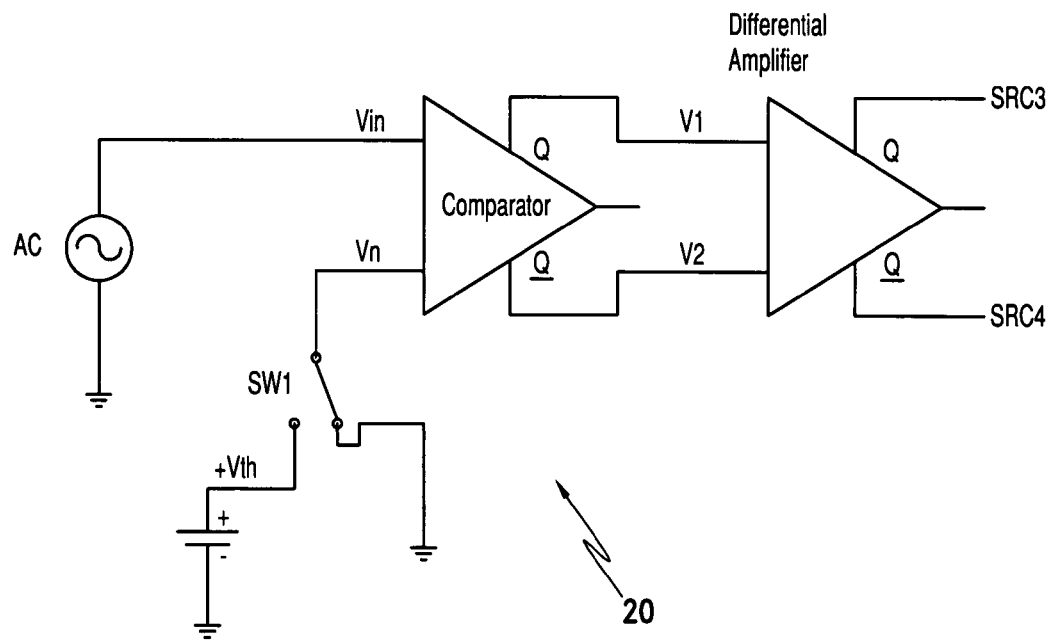
FIG. 4 is schematic illustration of a comparator circuit utilized with the wideband driver of the present invention.

Referring now to FIG. 4, use of a comparator circuit for adjusting the duty cycle to an optimum value is illustrated, designated generally as 20. The comparator 22 takes in the sinusoidal input (AC) and converts into two square waveforms of equal amplitude and 180-degree out-of-phase outputs, Q and Q_ (complementary outputs). If the switch SW1 is grounded as shown in FIG. 4, the duty cycle is 50%. If the switch is connected to a constant voltage source, Vth, then the duty cycle of the output square waveforms can be changed according to the magnitude of Vth. Since the outputs of the comparator in this case have already been complementary, the differential amplifier can accept two inputs, V1 and V2, and produce the two outputs, Vo1 and Vo2, which have the same magnitude and are 180-degree out of phase.

Referring again to FIG. 2, during operation, driver circuit 12 provides the floating point needed at the node connecting the two transistors together. When the upper transistor (Q1) is ON the current flows through the load encountering only the small series resistance of the transistor, and when the lower transistor (Q2) is ON the load dumps its current into that transistor with very little resistance in series. The resulting voltage waveforms driving the final stage are close to ideal square pulses that maintain the high efficiency class D operation desired.

Figure 5A:
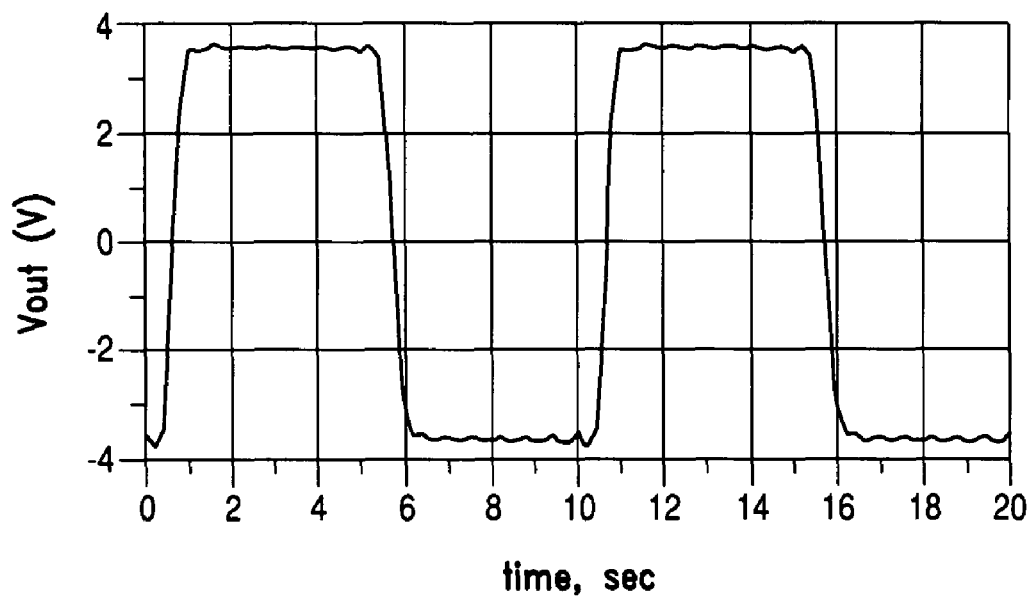
FIG. 5A is graph of volts vs. time illustrating an output waveform for an input square wave at 100 MHz.
Figure 5B:
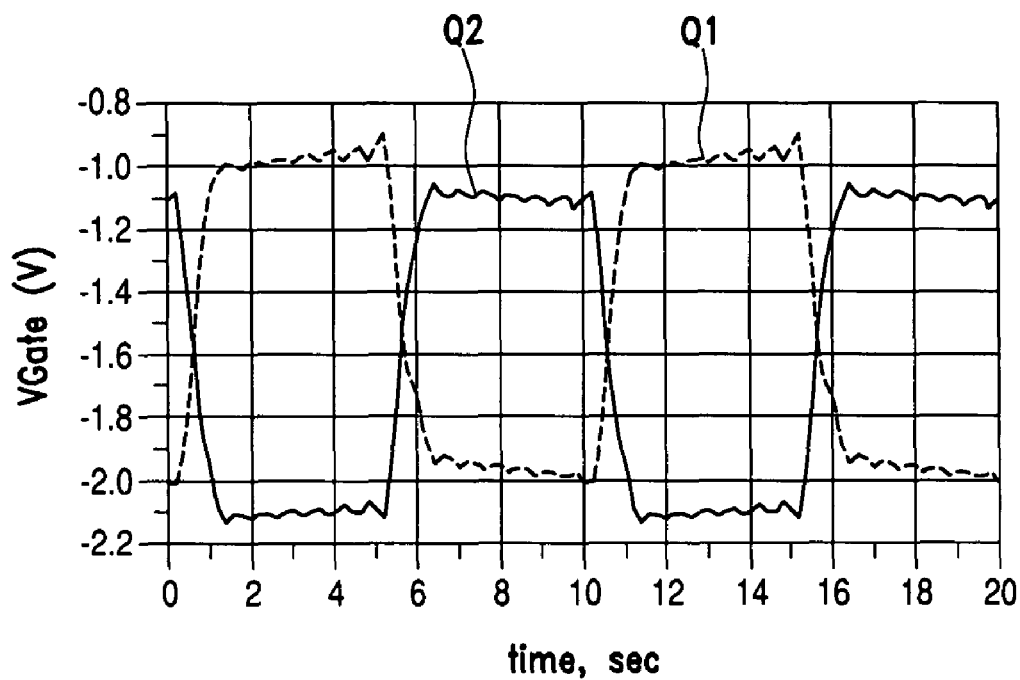
FIG. 5B is a graph of VGate vs. time illustrating gate waveforms of transistors Q1 and Q2.

Simulation of the circuit operation was done with Agilent's ADS (Advanced Design System) tool. The ADS is electronic design automation software system. FIG. 5A shows the output waveform for an input square wave at 100 MHz. FIG. 5B shows the gate waveforms of transistors Q1 and Q2.

The high speed pre-driver comparator chip shapes up the input sinusoidal signal turning it into an ideal square pulse with 50% duty cycle that is used to drive the driver circuit in FIG. 2.

Table 1 shows measured results on the built breadboard of the driver which drives a GaN Eudyna power device. An average power of over 60 watts is shown with an average efficiency above 80% up to 500 MHz.

TABLE 1

Measured output power and efficiency of the VHF/UHF class D power amplifier.

| Freq (MHz)      | 30    | 60    | 100   | 200   | 300   | 400   | 450   | 500   |
|-----------------|-------|-------|-------|-------|-------|-------|-------|-------|
| Po (W) Final    | 61    | 56    | 63    | 65    | 56    | 68    | 66    | 71    |
| I_final(A) @ 50 V | 1.42  | 1.53  | 1.5   | 1.61  | 1.73  | 1.91  | 1.92  | 1.95  |
| eff(%) final    | 85.92 | 73.20 | 84.00 | 80.75 | 64.74 | 71.20 | 68.75 | 72.82 |

The efficiency of the class D power amplifier can further be improved by 10% more using a duty cycle of about 35% rather than 50%. The change in duty cycle can be easily implemented using two comparator chips to adjust the duty cycle to the optimum value.

The wideband VHF/UHF class D amplifier of the present invention can be used as a stand-alone high efficiency power amplifier for constant envelope signals such as FM, and can also be used in a LINC (Linear amplification using Non-linear Circuits) configuration or EER (Envelope Elimination and Restoration) circuit to restore linearity required for non-constant envelope signals such as QAM-64, 8-PSK and OFDM.

Other embodiments and configurations may be devised without departing from the spirit of the invention and the scope of the appended claims.

The invention claimed is:

1. A Class-D amplifier, comprising:
   a) a wideband driver circuit, comprising:
      i) a first transmission line transformer; and,
      ii) a second transmission line transformer, an input of said first transmission line transformer being approximately 180 degrees out of phase from an input of said second transformer, the inputs of each of the transformers being derived from the same source;
   b) a first transistor (Q1) having an input operatively connected to said first transmission line transformer;
   c) a second transistor (Q2) having an input being operatively connected to said second transmission line transformer,
      wherein said first and said second transmission line transformers cooperate to provide a signal of sufficient magnitude to saturate their associated power transistors in the ON mode and to cut them off in the OFF mode with very small rise and fall transit times, thus providing high efficiency, and wherein
      i) said first transmission line transformer comprises a wideband Balanced-to-Unbalanced transmission line transformer (BALUN); and,
      ii) said second transmission line transformer comprises a wideband Unbalanced-to-Unbalanced transmission line transformer (UNUN); and,
   d) a differential amplifier connected to said first transmission line transformer and to said second transmission line transformer for providing said inputs of said first and second transmission line transformers.

2. The Class-D amplifier of claim 1, wherein:
   a) said first transmission line transformer comprises a wideband 4:1 Balanced-to-Unbalanced transmission line transformer (BALUN); and,
   b) said second transmission line transformer comprises a wideband 4:1 Unbalanced-to-Unbalanced transmission line transformer (UNUN).

3. The Class-D amplifier of claim 1, wherein:
   said BALUN and said UNUN each comprise a transmission line wound on a ferrite or air core.

4. The Class-D amplifier of claim 1, wherein:
   said BALUN and said UNUN each comprise a transmission line wound on a ferrite or air core, said transmission line comprising coaxial cables or bifilar wire.

5. The Class-D amplifier of claim 1, wherein:
   said BALUN and said UNUN each comprise striplines or microstrip lines on a printed circuit board with embedded ferrite core.

6. The Class-D amplifier of claim 1, wherein:
   said Q1 and Q2 comprise Field-effect transistors, the Source of Q1 being floating and the Source of Q2 being grounded.

7. The Class-D amplifier of claim 1, wherein:
   said Q1 and Q2 comprise bipolar transistors, the Emitter of Q1 being floating and the Emitter of Q2 being grounded.

8. The Class-D amplifier of claim 1, wherein:
   the input sources to said first and said second transmission line transformers comprises a square wave sources.

9. The Class-D amplifier of claim 1, wherein:
   the input sources to said first and said second transmission line transformers comprises a sinusoidal wave sources.

10. The Class-D amplifier of claim 1, wherein the output of said Class-D amplifier operates at VHF or UHF.

11. A Class-D amplifier, comprising:
    a) a wideband driver circuit, comprising:
       i) a first transmission line transformer; and,
       ii) a second transmission line transformer, an input of said first transmission line transformer being approximately 180 degrees out of phase from an input of said second transformer,
    b) a first transistor (Q1) having an input operatively connected to said first transmission line transformer;
    c) a second transistor (Q2) having an input being operatively connected to said second transmission line transformer;
    d) a differential amplifier connected to said first transmission line transformer and to said second transmission line transformer for providing said inputs of said first and second transmission line transformers; and,
    e) a comparator circuit connected to said driver circuit for adjusting the duty cycle to an optimum value,
       wherein said first and said second transmission line transformers cooperate to provide a signal of sufficient magnitude to saturate their associated power transistors in the ON mode and to cut them off in the OFF mode with very small rise and fall transit times, thus providing high efficiency.

12. The Class-D amplifier of claim 11, wherein:
    a) said first transmission line transformer comprises a wideband Balanced-to-Unbalanced transmission line transformer (BALUN); and,
    b) said second transmission line transformer comprises a wideband Unbalanced-to-Unbalanced transmission line transformer (UNUN).

13. The Class-D amplifier of claim 12, wherein:
    said BALUN and said UNUN each comprise a transmission line wound on a ferrite or air core.

14. The Class-D amplifier of claim 12, wherein:
    said BALUN and said UNUN each comprise a transmission line wound on a ferrite or air core, said transmission line comprising coaxial cables or bifilar wire.

15. The Class-D amplifier of claim 11, wherein:
    a) said first transmission line transformer comprises a wideband 4:1 Balanced-to-Unbalanced transmission line transformer (BALUN); and,
    b) said second transmission line transformer comprises a wideband 4:1 Unbalanced-to-Unbalanced transmission line transformer (UNUN).

16. A Class-D amplifier, comprising:
    a) a wideband driver circuit, comprising:
       i) a first transmission line transformer; and,
       ii) a second transmission line transformer, an input of said first transmission line transformer being approximately 180 degrees out of phase from an input of said second transformer, the inputs of each of the transformers being derived from the same source;
    b) a first transistor (Q1) having an input operatively connected to said first transmission line transformer;

c) a second transistor (Q2) having an input being operatively connected to said second transmission line transformer, wherein said first and said second transmission line transformers cooperate to provide a signal of sufficient magnitude to saturate their associated power transistors in the ON mode and to cut them off in the OFF mode with very small rise and fall transit times, thus providing high efficiency, and wherein iii) said first transmission line transformer comprises a wideband Balanced-to-Unbalanced transmission line transformer (BALUN); and,
   iv) said second transmission line transformer comprises a wideband Unbalanced-to-Unbalanced transmission line transformer (UNUN); and,
d) a comparator circuit connected to said driver circuit for adjusting the duty cycle to an optimum value.

* * * * *